(12) United States Patent
Tezak et al.

(10) Patent No.: US 11,694,108 B2
(45) Date of Patent: Jul. 4, 2023

(54) QUANTUM STREAMING KERNEL

(71) Applicant: Rigetti & Co, LLC, Berkeley, CA (US)

(72) Inventors: Nikolas Anton Tezak, Oakland, CA (US); Marcus Palmer da Silva, Lafayette, CA (US); Robert Stanley Smith, Emeryville, CA (US); Christopher Mogan Wilson, Toronto (CA)

(73) Assignee: Rigetti & Co, LLC, Berkeley, CA (US)

( * ) Notice: Subject to any disclaimer, the term of this patent is extended or adjusted under 35 U.S.C. 154(b) by 84 days.

(21) Appl. No.: 17/168,634

(22) Filed: Feb. 5, 2021

(65) Prior Publication Data

US 2022/0164693 A1 May 26, 2022

Related U.S. Application Data

(63) Continuation of application No. PCT/US2019/045866, filed on Aug. 9, 2019.

(60) Provisional application No. 62/716,678, filed on Aug. 9, 2018.

(51) Int. Cl.
| | |
|---|---|
| *H03K 19/19* | (2006.01) |
| *G06N 10/40* | (2022.01) |
| *G06N 10/20* | (2022.01) |
| *H03K 19/195* | (2006.01) |

(52) U.S. Cl.
CPC .............. *G06N 10/40* (2022.01); *G06N 10/20* (2022.01); *H03K 19/195* (2013.01)

(58) Field of Classification Search
CPC ....... G06N 10/20; G06N 10/40; H03K 19/195
See application file for complete search history.

(56) References Cited

U.S. PATENT DOCUMENTS

| | | | |
|---|---|---|---|
| 9,836,699 B1 | 12/2017 | Rigetti et al. | |
| 10,255,555 B2 * | 4/2019 | Curtis | ..................... G06N 5/022 |
| 10,268,232 B2 * | 4/2019 | Harris | ..................... G06N 3/04 |

(Continued)

FOREIGN PATENT DOCUMENTS

| | | |
|---|---|---|
| WO | 2017031356 | 2/2017 |
| WO | 2020033807 | 2/2020 |

OTHER PUBLICATIONS

Kipo, International Search Report and Written Opinion dated Nov. 25, 2019, in PCT/US2019/045866, 12 pgs.

(Continued)

*Primary Examiner* — Kurtis R Bahr
(74) *Attorney, Agent, or Firm* — Henry Patent Law Firm PLLC

(57) ABSTRACT

In a general aspect, a quantum streaming kernel processes a data stream. In some aspects, an input stream of data is converted to an output stream of data by repeatedly receiving new portions of the input stream; encoding each new portion into an internal quantum state of a quantum processor; measuring a first part of the internal quantum state while maintaining coherence of a second part of the internal quantum state; and producing the output stream of data based on the measurements. In some cases, a history of the input stream is preserved by the coherence of the internal quantum state, and the measurements contain information based on the history of the input stream.

27 Claims, 6 Drawing Sheets

(56) References Cited

U.S. PATENT DOCUMENTS

| | | | |
|---|---|---|---|
| 10,374,612 | B1 | 8/2019 | Sinclair et al. |
| 11,334,693 | B1* | 5/2022 | Flammia ................ G06N 10/70 |
| 11,551,127 | B1 | 1/2023 | Otterbach et al. |
| 2009/0182542 | A9 | 12/2005 | Hilton et al. |
| 2014/0297247 | A1* | 10/2014 | Troyer .................... G06F 30/20 |
| | | | 703/21 |
| 2016/0267032 | A1* | 9/2016 | Rigetti ................ G06F 13/4068 |
| 2016/0292586 | A1 | 10/2016 | Rigetti et al. |
| 2017/0177534 | A1 | 6/2017 | Mohseni et al. |
| 2018/0096085 | A1* | 4/2018 | Rubin .................... G16C 10/00 |
| 2018/0114138 | A1 | 4/2018 | Monroe et al. |
| 2018/0232652 | A1 | 8/2018 | Curtis et al. |
| 2018/0260245 | A1 | 9/2018 | Smith |
| 2018/0260730 | A1 | 9/2018 | Reagor et al. |
| 2018/0365585 | A1 | 12/2018 | Smith et al. |
| 2020/0169396 | A1* | 5/2020 | Neven ................... H04L 9/0852 |

OTHER PUBLICATIONS

"Neural Networks, Manifolds, and Topology", URL:http://colah.github.io/posts/2014-03-NN-Manifolds-Topology/, Apr. 6, 2014, 13 pgs.

Aaronson, et al., "The Computational Complexity of Linear Optics", arXiv:1011.3245v1, Nov. 14, 2010, 94 pgs.

Aharonov, et al., "Fault-Tolerant Quantum Computation with Constant Error Rate", SIAM Journal of Computing 38(4), Jul. 2008, 76 pgs.

Aliferis, et al., "Quantum Accuracy Threshold for Concatenated Distance-3 Codes", Quantum Information and Computation 6(2), 2006, 69 pgs.

Bendetti, et al., "A generative modeling approach for benchmarking and training shallow quantum circuits", arXiv:1801.07686v1 [quant-ph], Jan. 23, 2018, 14 pgs.

Brandao, et al., "Quantum SDP Solvers: Large Speed-ups, Optimality, and Applications to Quantum Learning", arXiv:1710.02581, Apr. 22, 2019, 40 pgs.

Brandao, et al., "Quantum Speed-Ups for Solving Semidefinite Programs", 58th Annual IEEE Symposium on Foundations of Computer Science, 2017, 12 pgs.

Bremner, et al., "Achieving quantum supremacy with sparse and noisy commuting quantum computions", Quantum 1, 8, 2017, 23 pgs.

Cross, et al., "Quantum learning robust against noise", Phys.Rev. A 92, Jul. 27, 2015, 5 pgs.

Cross, et al., "Quantum learning robust to noise", arXiv:1407.5088v1, Jul. 18, 2014, 6 pgs.

Farhi, E., et al., "A Quantum Approximate Optimization Algorithm", arXiv:1411.4028v1 [quant-ph], Nov. 14, 2014, 16 pages.

Farhi, et al., "Classification with Quantum Neural Networks on Near Term Processors", arXiv:1802.06002v1, Feb. 16, 2018, 21 pgs.

Farhi, et al., "Quantum Algorithms for Fixed Qubit Architectures", arXiv:1703.06199v1, Mar. 17, 2017, 20 pgs.

Farhi, E., et al., "Quantum Supremacy through the Quantum Approximate Optimization Algorithm", arXiv:1602.07674v1 [quant-ph], Feb. 24, 2016, 22 pages.

Fujii, et al., "Harnessing disordered quantum dynamics for machine learning", arXiv:1602.08159v1, Feb. 26, 2016, 19 pgs.

Fujii, et al., "Harnessing Disordered-Ensemble Quantum Dynamics for Machine Learning", PhysRevApplied.8.024030, Aug. 30, 2017, 22 pgs.

Grant, et al., "Hierarchical quantum classifiers", arXiv:1804.03680v1, Apr. 10, 2018, 15 pgs.

Harrow, et al., "Quantum Algorithm for Linear Systems of Equations", Phys.Rev.Lett. 103, Oct. 9, 2009, 4 pgs.

Harrow, et al., "Quantum algorithm for solving linear systems of equations", arXiv:0811.3171v3, Sep. 30, 2009, 16 pgs.

Havlicek, et al., "Supervised learning with quantum enhanced feature spaces", arXiv:1804.11326v1, Apr. 30, 2018, 21 pgs.

Havlicek, et al., "Supervised learning with quantum enhanced feature spaces", arXiv:1804.11326v2 [quant-ph], Jun. 5, 2018, 22 pgs.

Hofmann, et al., "Kernel Methods in Machine Learning", Ann. Statist. 36, 2008, 50 pgs.

Huggins, et al., "Towards Quantum Machine Learning with Tensor Networks", arXiv:1803.11537v1, Mar. 30, 2018, 10 pgs.

Kandala, et al., "Hardware-efficient Variational Quantum Eigensolver for Small Molecules and Quantum Magnets", arXiv:1704.05018, Oct. 13, 2017, 26 pgs.

Kandala, et al., "Hardware-efficient variational quantum eigensolver for small molecules and quantum magnets", Nature 549, Sep. 14, 2017, 5 pgs.

Kerenidis, et al., "Quantum Recommendation Systems", arXiv:1603.08675v3, Sep. 22, 2016, 22 pgs.

Knill, et al., "Resilient Quantum Computation", Science 279(5349), 1998, 4 pgs.

Lecun, et al., "Gradient-Based Learning Applied to Document Recognition", Proceedings of the IEEE, vol. 86, No. 11, Nov. 1998, 47 pgs.

Lloyd, et al., "Quantum principal component analysis", Nature Physics Letters, Jul. 27, 2014, 3 pgs.

Lloyd, et al., "Quantum principal component analysis", arXiv:1307.0401, Sep. 16, 2013, 10 pgs.

May, et al., "Kernel Approximation Methods for Speech Recognition", arXiv:1701.03577v1, Jan. 13, 2017, 31 pgs.

Nielsen, et al., "Quantum Computation and Quantum Information", Cambridge Univ. Press, 2010, 704 pgs.

Pathak, et al., "Model-Free Prediction of Large Spatiotemporally Chaotic Systems from Data: A Reservoir Computing Approach", Physical Review Letters 120, 024102, Jan. 12, 2018, 5 pgs.

Peruzzo, Alberto, et al., "A Variational Eigenvalue Solver on a Photonic Quantum Processor", Nature Communications, DOI: 10.1038/ncomms5213, Jul. 23, 2014; 7 pgs.

Preskill, "quantum Computing in the NISQ era and beyond", arXiv:1801.00862v2, Jan. 27, 2018, 22 pgs.

Rahimi, et al., "Random Features for Large-Scale Kernel Machines", Advances in Neural Information Processing Systems (NIPS), 2007, 13 pgs.

Rahimi, et al., "Reflections on Random Kitchen Sinks", http://www.argmin.net/2017/12/05/kitchen-sinks, Dec. 5, 2017, 10 pgs.

Rahimi, et al., "Uniform Approximation of Functions with Random Bases", https://ieeexplore.IEEE.org/document/4797607, 2008, 7 pgs.

Rahimi, et al., "Weighted Sums of Random Kitchen Sinks: Replacing minimization with randomization in learning", Advances in Neural Information Processing Systems (NIPS), 2008, 13 pgs.

Rebentrost, et al., "Quantum support vector machine for big data classification", arXiv:1307.0471, 2014, 6 pgs.

Rebentrost, et al., "Quantum Support Vector Machine for Big Data Classification", Phys.Rev.Lett. 113, 130503, Sep. 26, 2014, 5 pgs.

Schoelkopf, et al., "Learning with kernels: support vector machines, regularizaiton, optimization, and beyond", MIT Press, 2002, 639 pgs.

Schuld, et al., "Circuit-centric quantum classifiers", arXiv:1804.00633v1 [quant-ph], Apr. 2, 2018, 17 pgs.

Schuld, et al., "Quantum machine learning in feature Hilbert spaces", arXiv:1803.07128v1 [quant-ph], Mar. 19, 2018, 12 pgs.

Smith, R. S., et al., "A Practical Quantum Instruction Set Architecture", arXiv:1608.03355v2 [quant-ph], Feb. 17, 2017, 15 pages.

Smith, Robert S, et al., "A Practical Quantum Instruction Set Architecture", arXiv:1608.03355v1 [quant-ph], Aug. 11, 2016, 14 pages.

Wiskott, et al., "Slow Feature Analysis: Unsupervised Learning of Invariances", Neural Computation 14, 715-770, 2002, 56 pgs.

Wolchover, "Chaos Theory: Machine Learning's "Amazing" Ability to Predict Chaos", Quanta magazine; https://www.quantamagazine.org/machine-learnings-amazing-ability-to-predict-chaos-20180418/, Apr. 18, 2018, 5 pgs.

Yang, et al., "Optimizing Variational Quantum Algorithms Using Pontryagin's Minimum Principle", Phys.Rev. X 7, May 18, 2017, 10 pgs.

(56) References Cited

OTHER PUBLICATIONS

USPTO, Notice of Allowance dated Oct. 12, 2022, in U.S. Appl. No. 16/408,052, 23 pgs.

* cited by examiner

QUANTUM STREAMING KERNEL

CROSS-REFERENCE TO RELATED APPLICATIONS

This application is a continuation of PCT/US2019/045866 filed Aug. 9, 2019, which claims priority to U.S. Provisional Application No. 62/716,678 filed Aug. 9, 2018, and entitled "Quantum Streaming Kernel." The entire contents of the above-referenced priority applications are hereby incorporated by reference.

BACKGROUND

The following description relates to quantum streaming kernels.

Quantum computers can perform computational tasks by executing quantum algorithms. A quantum algorithm can be represented, for example, as a quantum Hamiltonian, a sequence of quantum logic operations, a set of quantum machine instructions, or otherwise. A variety of physical systems have been proposed as quantum computing systems. Examples include superconducting circuits, trapped ions, spin systems and others.

DETAILED DESCRIPTION

Figure 1:
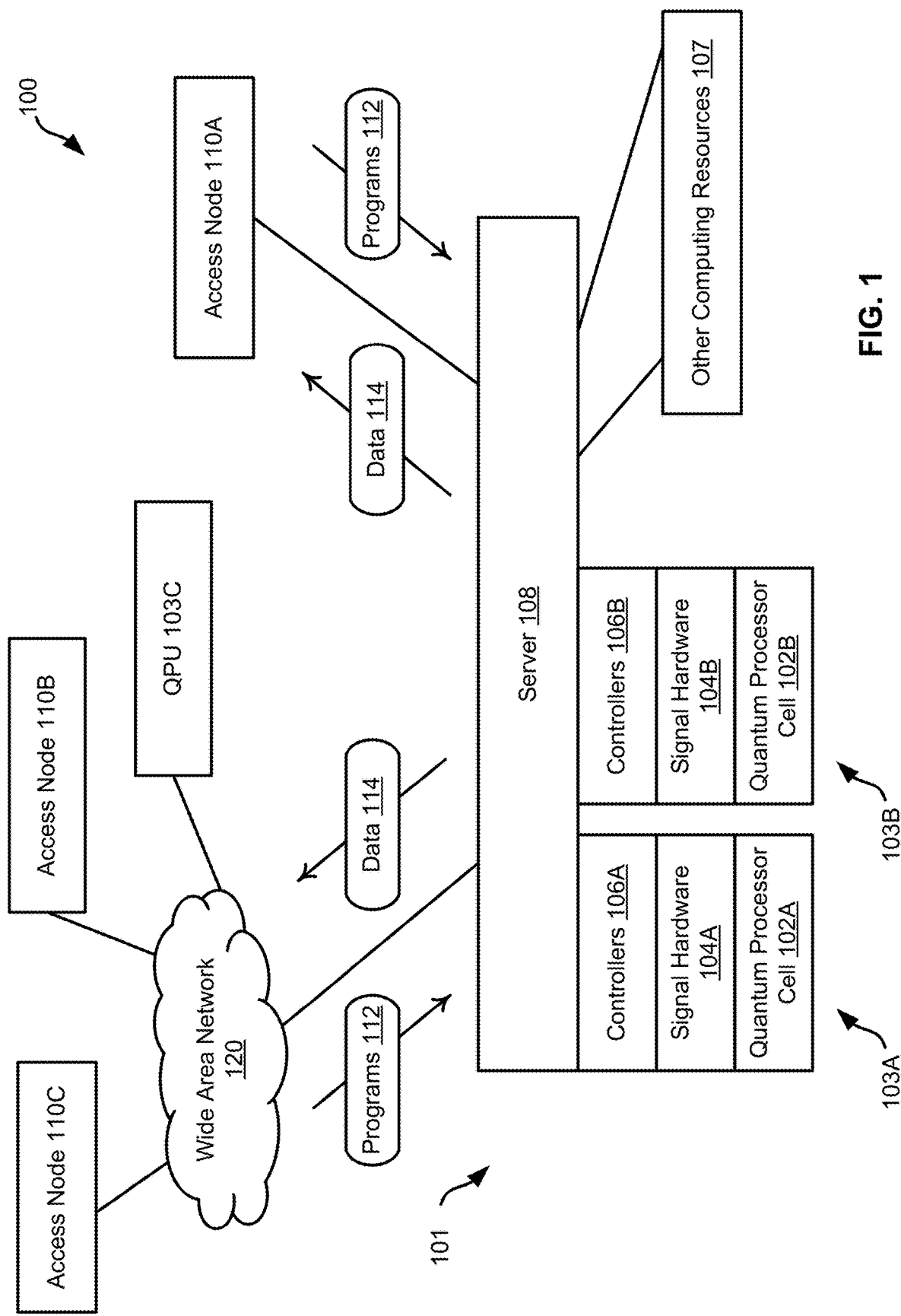
FIG. 1 is a block diagram of an example computing system.

In some aspects of what is described here, a quantum processor unit (QPU) can be used to process a stream of input data. For example, a QPU may operate as a quantum streaming kernel, which can preprocess data for a variety of classical or quantum data processing applications, for instance, to improve the performance of such classical or quantum data processing applications. In some cases, the stream of input data has a structured time dependence, for example, data from a video or audio feed, stock market data, weather data, etc. The QPU can process the input data stream over time while producing an output data stream and maintaining a coherent quantum state that depends on the history of input data. In some cases, an intrinsic temporal correlation in the input stream can be manifest as temporal correlations in quantum memory.

In some aspects, a QPU can be used to indefinitely process streaming data and continually extract useful output information based on the history of input data and the QPU's internal quantum state. By continually streaming in new information and only partially measuring the quantum state of the QPU to obtain an output signal, the high dimensionality of the QPU's internal state space can be harnessed, and there is no need to fully collapse the system state (as it would be if a projective measurement were applied to all qubits). At any given time, the internal quantum state of the QPU may encode useful information about the input signal's recent history, e.g., whether the recent input signal history follows one of several typical patterns, or whether there has been an anomalous input pattern.

In some implementations, the intrinsically quantum non-linearity of a QPU is used to preprocess data for a computationally-intensive algorithm executed by another computer system or to replace computationally-intensive steps of an algorithm executed by another computer system. In some examples, the QPU processes data for a machine learning algorithm, an image processing algorithm, an audio or signal processing algorithm, or another type of computationally-intensive application executed by computer systems.

In some cases, the output from the QPU can be combined with classical postprocessing (e.g., a linear transformation), and the measured output bits in each time step may then be used to predict useful features about the streaming input signal. For instance, the QPU output may be used for forecasting (e.g., predicting the input signal for a future time step), for anomaly detection (e.g., flagging a recent input pattern as anomalous), classification (e.g., assigning a label to the most recent/ongoing input pattern) or latent feature prediction (e.g., predicting an unobserved characteristic of the input process). Generally, a quantum streaming kernel can be implemented using a variety of QPU hardware (e.g., ion traps, superconducting circuits, optical quantum computers, semi-classical systems such as a coherent Ising machine, etc.).

In some implementations, the techniques and systems described here provide technical advantages and improvements over existing approaches, for example, for data processing applications. For instance, in various cases, a QPU may operate in a continual fashion without fully destroying (collapsing) the full QPU's coherent quantum state when information is read out; this allows coherent quantum information to persist over many input and output episodes, which enables non-trivial mappings between whole sequences of inputs to the output. Data can be streamed through the system continually, and thereby long memory time scales can be used to provide a feature mapping that depends on the history of inputs in addition to the most recent one. In some cases, a small quantum streaming kernel that only harnesses a part of a larger quantum system can be trained, and the output nodes of the quantum streaming kernel can be used to drive the input nodes of a neighboring quantum streaming kernel. In this way, one may be able to realize increasingly sophisticated and useful data processing workflows.

FIG. 1 is a block diagram of an example computing system 100. The example computing system 100 shown in FIG. 1 includes a computing environment 101 and access nodes 110A, 110B, 110C. A computing system may include additional or different features, and the components of a computing system may operate as described with respect to FIG. 1 or in another manner.

The example computing environment 101 includes computing resources and exposes their functionality to the access nodes 110A, 110B, 110C (referred to collectively as "access nodes 110"). The computing environment 101 shown in FIG. 1 includes a server 108, quantum processor units 103A, 103B and other computing resources 107. The computing environment 101 may also include one or more of the access nodes (e.g., the example access node 110A) and other features and components. A computing environment may include additional or different features, and the components of a computing environment may operate as described with respect to FIG. 1 or in another manner.

The example computing environment 101 can provide services to the access nodes 110, for example, as a cloud-based or remote-accessed computer, as a distributed computing resource, as a supercomputer or another type of high-performance computing resource, or in another manner. The computing environment 101 or the access nodes 110 may also have access to one or more remote QPUs (e.g., QPU 103C). As shown in FIG. 1, to access computing resources of the computing environment 101, the access nodes 110 send programs 112 to the server 108 and in response, the access nodes 110 receive data 114 from the server 108. The access nodes 110 may access services of the computing environment 101 in another manner, and the server 108 or other components of the computing environment 101 may expose computing resources in another manner.

Any of the access nodes 110 can operate local to, or remote from, the server 108 or other components of the computing environment 101. In the example shown in FIG. 1, the access node 110A has a local data connection to the server 108 and communicates directly with the server 108 through the local data connection. The local data connection can be implemented, for instance, as a wireless Local Area Network, an Ethernet connection, or another type of wired or wireless connection. Or in some cases, a local access node can be integrated with the server 108 or other components of the computing environment 101. Generally, the computing system 100 can include any number of local access nodes.

In the example shown in FIG. 1, the access nodes 110B, 110C and the QPU 103C each have a remote data connection to the server 108, and each communicates with the server 108 through the remote data connection. The remote data connection in FIG. 1 is provided by a wide area network 120, such as, for example, the Internet or another type of wide area communication network. In some cases, remote access nodes use another type of remote data connection (e.g., satellite-based connections, a cellular network, a private network, etc.) to access the server 108. Generally, the computing system 100 can include any number of remote access nodes.

The example server 108 shown in FIG. 1 communicates with the access nodes 110 and the computing resources in the computing environment 101. For example, the server 108 can delegate computational tasks to the quantum processor units 103A, 103B and the other computing resources 107, and the server 108 can receive the output data from the computational tasks performed by the quantum processor units 103A, 103B and the other computing resources 107. In some implementations, the server 108 includes a personal computing device, a computer cluster, one or more servers, databases, networks, or other types of classical or quantum computing equipment. The server 108 may include additional or different features, and may operate as described with respect to FIG. 1 or in another manner.

Each of the example quantum processor units 103A, 103B operates as a quantum computing resource in the computing environment 101. The other computing resources 107 may include additional quantum computing resources (e.g., quantum processor units, quantum virtual machines (QVMs) or quantum simulators) as well as classical (non-quantum) computing resources such as, for example, digital microprocessors, specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), etc., or combinations of these and other types of computing modules.

In some implementations, the server 108 generates computing jobs, identifies an appropriate computing resource (e.g., a QPU or QVM) in the computing environment 101 to execute the computing job, and sends the computing job to the identified resource for execution. For example, the server 108 may send a computing job to the quantum processor unit 103A, the quantum processor unit 103B or any of the other computing resources 107. A computing job can be formatted, for example, as a computer program, function, code or other type of computer instruction set. Each computing job includes instructions that, when executed by an appropriate computing resource, perform a computational task and generate output data based on input data. For example, a computing job can include instructions formatted for a quantum processor unit, a quantum virtual machine, a digital microprocessor, co-processor or other classical data processing apparatus, or another type of computing resource.

In some implementations, the server 108 operates as a host system for the computing environment 101. For example, the access nodes 110 may send programs 112 to server 108 for execution in the computing environment 101. The server 108 can store the programs 112 in a program queue, generate one or more computing jobs for executing the programs 112, generate a schedule for the computing jobs, allocate computing resources in the computing environment 101 according to the schedule, and delegate the computing jobs to the allocated computing resources. The server 108 can receive, from each computing resource, output data from the execution of each computing job. Based on the output data, the server 108 may generate additional computing jobs, generate data 114 that is provided back to an access node 110, or perform another type of action.

In some implementations, an access node 110 provides a job that runs indefinitely, for example, as a continuing input data stream (rather than, for example, a job that is self-contained or has a bounded execution time). For instance, a job may run indefinitely or until it is forcibly interrupted, and the access node 110 that launches the job may keep re-supplying it with new input data continually over time. In these and other scenarios, a computing job may include a specification of certain qubits as measurement qubits (e.g., the example output qubits shown in FIG. 3A or the example output layers shown in FIGS. 3B and 5), a specification of an input preprocessing map (e.g., to be executed on the co-processor 212 in FIG. 2 or the preprocessor 414 in FIG. 4), an update quantum logic circuit (e.g., one or more of operations 510, 512, 514, 516, 518, 520, 522 in FIG. 5) to be used to encode new input data into the QPU at each time step, a specification of an output post-processing map (e.g., to be executed on the data processing system 210 in FIG. 2 or the postprocessor 422 in FIG. 4), and possibly other elements. Once the computing environment 101 begins executing the job, the server 108 may offer the access node 110 access to data sockets (e.g., through a host API or another type of interface). For example, the server 108 may offer a socket that the access node 110 can use to continually write new input data, and another socket from which the access node 110 can continually read output data.

In some implementations, all or part of the computing environment 101 operates as a cloud-based quantum computing (QC) environment, and the server 108 operates as a host system for the cloud-based QC environment. For example, the programs 112 can be formatted as quantum computing programs for execution by one or more quantum processor units. The server 108 can allocate quantum computing resources (e.g., one or more QPUs, one or more quantum virtual machines, etc.) in the cloud-based QC environment according to the schedule, and delegate quantum computing jobs to the allocated quantum computing resources for execution.

In some implementations, all or part of the computing environment 101 operates as a hybrid computing environment, and the server 108 operates as a host system for the hybrid environment. For example, the programs 112 can be formatted as hybrid computing programs, which include instructions for execution by one or more quantum processor units and instructions that can be executed by another type of computing resource. The server 108 can allocate quantum computing resources (e.g., one or more QPUs, one or more quantum virtual machines, etc.) and other computing resources in the hybrid computing environment according to the schedule, and delegate computing jobs to the allocated computing resources for execution. The other (non-quantum) computing resources in the hybrid environment may include, for example, one or more digital microprocessors, one or more specialized co-processor units (e.g., graphics processing units (GPUs), cryptographic co-processors, etc.), special purpose logic circuitry (e.g., field programmable gate arrays (FPGAs), application-specific integrated circuits (ASICs), etc.), systems-on-chips (SoCs), or other types of computing modules.

In some cases, the server 108 can select the type of computing resource (e.g., quantum or otherwise) to execute an individual computing job in the computing environment 101. For example, the server 108 may select a particular quantum processor unit (QPU) or other computing resource based on availability of the resource, speed of the resource, information or state capacity of the resource, a performance metric (e.g., process fidelity) of the resource, or based on a combination of these and other factors. In some cases, the server 108 can perform load balancing, resource testing and calibration, and other types of operations to improve or optimize computing performance.

The example server 108 shown in FIG. 1 may include a quantum machine instruction library or other resources that the server 108 uses to produce quantum computing jobs to be executed by quantum computing resources in the computing environment 101 (e.g., by the quantum processor unit 103). The quantum machine instruction library may include, for example, calibration procedures, hardware tests, quantum algorithms, quantum gates, etc. The quantum machine instruction library can include a file structure, naming convention, or other system that allows the resources in the quantum machine instruction library to be invoked by the programs 112. For instance, the server 108 or the computing environment 101 can expose the quantum machine instruction library to the access nodes 110 through a set of application programming interfaces (APIs). Accordingly, the programs 112 that are produced by the access nodes 110 and delivered to the server 108 may include information that invokes a quantum machine instruction library stored at the server 108. In some implementations, one or more of the access nodes 110 includes a local version of a quantum machine instruction library. Accordingly, the programs 112 that are produced by the access node 110B and delivered to the server 108 may include instruction sets from a quantum machine instruction library.

Each of the example quantum processor units 103A, 103B, 103C shown in FIG. 1 can perform quantum computational tasks by executing quantum machine instructions. In some implementations, a quantum processor unit can perform quantum computation by storing and manipulating information within quantum states of a composite quantum system. For example, qubits (i.e., quantum bits) can be stored in and represented by an effective two-level sub-manifold of a quantum coherent physical system. In some instances, quantum logic can be executed in a manner that allows large-scale entanglement within the quantum system. Control signals can manipulate the quantum states of individual qubits and the joint states of multiple qubits. In some instances, information can be read out from the composite quantum system by measuring the quantum states of the qubits. In some implementations, the quantum states of the qubits are read out by measuring the transmitted or reflected signal from auxiliary quantum devices that are coupled to individual qubits.

In some implementations, a quantum processor unit (e.g., QPU 103A or QPU 103B) can operate using gate-based models for quantum computing. For example, the qubits can be initialized in an initial state, and a quantum logic circuit comprised of a series of quantum logic gates can be applied to transform the qubits and extract measurements representing the output of the quantum computation. In some implementations, a quantum processor unit (e.g., QPU 103A or QPU 103B) can operate using adiabatic or annealing models for quantum computing. For instance, the qubits can be initialized in an initial state, and the controlling Hamiltonian can be transformed adiabatically by adjusting control parameters to another state that can be measured to obtain an output of the quantum computation.

In some models, fault-tolerance can be achieved by applying a set of high-fidelity control and measurement operations to the qubits. For example, quantum error correcting schemes can be deployed to achieve fault-tolerant quantum computation, or other computational regimes may be used. Pairs of qubits can be addressed, for example, with two-qubit logic operations that are capable of generating entanglement, independent of other pairs of qubits. In some implementations, more than two qubits can be addressed, for example, with multi-qubit quantum logic operations capable of generating multi-qubit entanglement. In some implementations, the quantum processor unit 103A is constructed and operated according to a scalable quantum computing architecture. For example, in some cases, the architecture can be scaled to a large number of qubits to achieve large-scale general purpose coherent quantum computing.

The example quantum processor unit 103A shown in FIG. 1 includes controllers 106A, signal hardware 104A, and a quantum processor cell 102A; similarly the example quantum processor unit 103B shown in FIG. 1 includes controllers 106B, signal hardware 104B, and a quantum processor cell 102B. A quantum processor unit may include additional or different features, and the components of a quantum processor unit may operate as described with respect to FIG. 1 or in another manner.

In some instances, all or part of the quantum processor cell 102A functions as a quantum processor, a quantum memory, or another type of subsystem. In some examples, the quantum processor cell 102A includes a quantum circuit system. The quantum circuit system may include qubit devices, resonator devices and possibly other devices that are used to store and process quantum information. In some cases, the quantum processor cell 102A includes a superconducting circuit, and the qubit devices are implemented as circuit devices that include Josephson junctions, for example, in superconducting quantum interference device (SQUID) loops or other arrangements, and are controlled by radio-frequency signals, microwave signals, and bias signals delivered to the quantum processor cell 102A. In some cases, the quantum processor cell 102A includes an ion trap system, and the qubit devices are implemented as trapped ions controlled by optical signals delivered to the quantum processor cell 102A. In some cases, the quantum processor cell 102A includes a spin system, and the qubit devices are implemented as nuclear or electron spins controlled by microwave or radio-frequency signals delivered to the quantum processor cell 102A. The quantum processor cell 102A may be implemented based on another physical modality of quantum computing.

In some implementations, the example quantum processor cell 102A can process quantum information by applying control signals to the qubits in the quantum processor cell 102A. The control signals can be configured to encode information in the qubits, to process the information by performing quantum logic gates or other types of operations, or to extract information from the qubits. In some examples, the operations can be expressed as single-qubit logic gates, two-qubit logic gates, or other types of quantum logic gates that operate on one or more qubits. A sequence of quantum logic operations can be applied to the qubits to perform a quantum algorithm. The quantum algorithm may correspond to a computational task, a hardware test, a quantum error correction procedure, a quantum state distillation procedure, or a combination of these and other types of operations.

The example signal hardware 104A includes components that communicate with the quantum processor cell 102A. The signal hardware 104A may include, for example, waveform generators, amplifiers, digitizers, high-frequency sources, DC sources, AC sources and other type of components. The signal hardware may include additional or different features and components. In the example shown, components of the signal hardware 104A are adapted to interact with the quantum processor cell 102A. For example, the signal hardware 104A can be configured to operate in a particular frequency range, configured to generate and process signals in a particular format, or the hardware may be adapted in another manner.

In some instances, one or more components of the signal hardware 104A generate control signals, for example, based on control information from the controllers 106A. The control signals can be delivered to the quantum processor cell 102A to operate the quantum processor unit 103A. For instance, the signal hardware 104A may generate signals to implement quantum logic operations, readout operations or other types of operations. As an example, the signal hardware 104A may include arbitrary waveform generators (AWGs) that generate electromagnetic waveforms (e.g., microwave or radio-frequency) or laser systems that generate optical waveforms. The waveforms or other types of signals generated by the signal hardware 104A can be delivered to devices in the quantum processor cell 102A to operate qubit devices, readout devices, bias devices, coupler devices or other types of components in the quantum processor cell 102A.

In some instances, the signal hardware 104A receives and processes signals from the quantum processor cell 102A. The received signals can be generated by operation of the quantum processor unit 103A. For instance, the signal hardware 104A may receive signals from the devices in the quantum processor cell 102A in response to readout or other operations performed by the quantum processor cell 102A. Signals received from the quantum processor cell 102A can be mixed, digitized, filtered, or otherwise processed by the signal hardware 104A to extract information, and the information extracted can be provided to the controllers 106A or handled in another manner. In some examples, the signal hardware 104A may include a digitizer that digitizes electromagnetic waveforms (e.g., microwave or radio-frequency) or optical signals, and a digitized waveform can be delivered to the controllers 106A or to other signal hardware components. In some instances, the controllers 106A process the information from the signal hardware 104A and provide feedback to the signal hardware 104A; based on the feedback, the signal hardware 104A can in turn generate new control signals that are delivered to the quantum processor cell 102A.

In some implementations, the signal hardware 104A includes signal delivery hardware that interface with the quantum processor cell 102A. For example, the signal hardware 104A may include filters, attenuators, directional couplers, multiplexers, diplexers, bias components, signal channels, isolators, amplifiers, power dividers and other types of components. In some instances, the signal delivery hardware performs preprocessing, signal conditioning, or other operations to the control signals to be delivered to the quantum processor cell 102A. In some instances, signal delivery hardware performs preprocessing, signal conditioning or other operations on readout signals received from the quantum processor cell 102A.

The example controllers 106A communicate with the signal hardware 104A to control operation of the quantum processor unit 103A. The controllers 106A may include digital computing hardware that directly interface with components of the signal hardware 104A. The example controllers 106A may include processors, memory, clocks and other types of systems or subsystems. The processors may include one or more single- or multi-core microprocessors, digital electronic controllers, special purpose logic circuitry, e.g., an FPGA (field programmable gate array) or an ASIC (application specific integrated circuit), or other types of data processing apparatus. The memory may include any type of volatile or non-volatile memory, a digital or quantum memory, or another type of computer storage medium. The controllers 106A may include additional or different features and components.

In some implementations, the controllers 106A include memory or other components that store quantum state information, for example, based on qubit readout operations performed by the quantum processor unit 103A. For instance, the states of one or more qubits in the quantum processor cell 102A can be measured by qubit readout operations, and the measured state information can be stored in a cache or other type of memory system in or more of the controllers 106A. In some cases, the measured state information is used in the execution of a quantum algorithm, a quantum error correction procedure, a quantum processor unit (QPU) calibration or testing procedure, or another type of quantum process.

In some implementations, the controllers 106A include memory or other components that store quantum machine instructions, for example, representing a quantum program for execution by the quantum processor unit 103A. In some cases, the quantum machine instructions are received from the server 108 in a hardware-independent format. For example, quantum machine instructions may be provided in a quantum instruction language such as Quil, described in the publication "A Practical Quantum Instruction Set Architecture," arXiv:1608.03355v2, dated Feb. 17, 2017, or another quantum instruction language. For instance, the quantum machine instructions may be written in a format that can be executed by a broad range of quantum processor units or quantum virtual machines.

In some instances, the controllers 106A can interpret the quantum machine instructions and generate a hardware-specific control sequences configured to execute the operations proscribed by the quantum machine instructions. For example, the controllers 106A may generate control information that is delivered to the signal hardware 104A and converted to control signals that control the quantum processor cell 102A.

In some implementations, the controllers 106A include one or more clocks that control the timing of operations. For example, operations performed by the controllers 106A may be scheduled for execution over a series of clock cycles, and clock signals from one or more clocks can be used to control the relative timing of each operation or groups of operations. In some cases, the controllers 106A schedule control operations according to quantum machine instructions in a quantum computing program, and the control information is delivered to the signal hardware 104A according to the schedule in response to clock signals from a clock or other timing system.

In some implementations, the controllers 106A include processors or other components that execute computer program instructions (e.g., instructions formatted as software, firmware, or otherwise). For example, the controllers 106A may execute a quantum processor unit (QPU) driver software, which may include machine code compiled from any type of programming language (e.g., Python, C++, etc.) or instructions in another format. In some cases, QPU driver software receives quantum machine instructions (e.g., based on information from the server 108) and quantum state information (e.g., based on information from the signal hardware 104A), and generates control sequences for the quantum processor unit 103A based on the quantum machine instructions and quantum state information.

In some instances, the controllers 106A generate control information (e.g., a digital waveform) that is delivered to the signal hardware 104A and converted to control signals (e.g., analog waveforms) for delivery to the quantum processor cell 102A. The digital control information can be generated based on quantum machine instructions, for example, to execute quantum logic operations, readout operations, or other types of control.

In some instances, the controllers 106A extract qubit state information from qubit readout signals, for example, to identify the quantum states of qubits in the quantum processor cell 102A or for other purposes. For example, the controllers may receive the qubit readout signals (e.g., in the form of analog waveforms) from the signal hardware 104A, digitize the qubit readout signals, and extract qubit state information from the digitized signals.

The other QPU 103B and its components (e.g., the quantum processor cell 102B, the signal hardware 104B and controllers 106B) can be implemented, and in some instances operate, as described above with respect to the QPU 103A; in some cases, the QPU 103B and its components may be implemented or may operate in another manner. Similarly, the remote QPU 103C and its components can be implemented, and in some instances operate, in an analogous manner.

The example computing environment 101 can be configured such that the quantum processor unit 103 functions as a preprocessing unit that modifies data for subsequent processing by the access nodes 110 or other computing resources 107. In some implementations, the server 108 manages data flows between the quantum processor unit 103 and one or more classical computers, for example, in a hybrid computing regime. In this capacity, the quantum processor unit 103 may improve the effectiveness of algorithms executed by classical computers, such as those adapted for machine learning, image processing, etc. For example, the quantum processor unit 103 may improve the operation of a classical linear classifier algorithm (e.g., to distinguish between digitized images of different subjects) or another type of machine learning system. In other implementations, the server 108 manages data flows between a quantum processor unit and one or more additional quantum processing units. The one or more additional quantum processing units may be deployed in the computing environment, for instance, as one or more of the other computing resources 107. In these implementations, the additional quantum processing units are configured to receive and process data preprocessed by the quantum processor unit 103.

Figure 2:
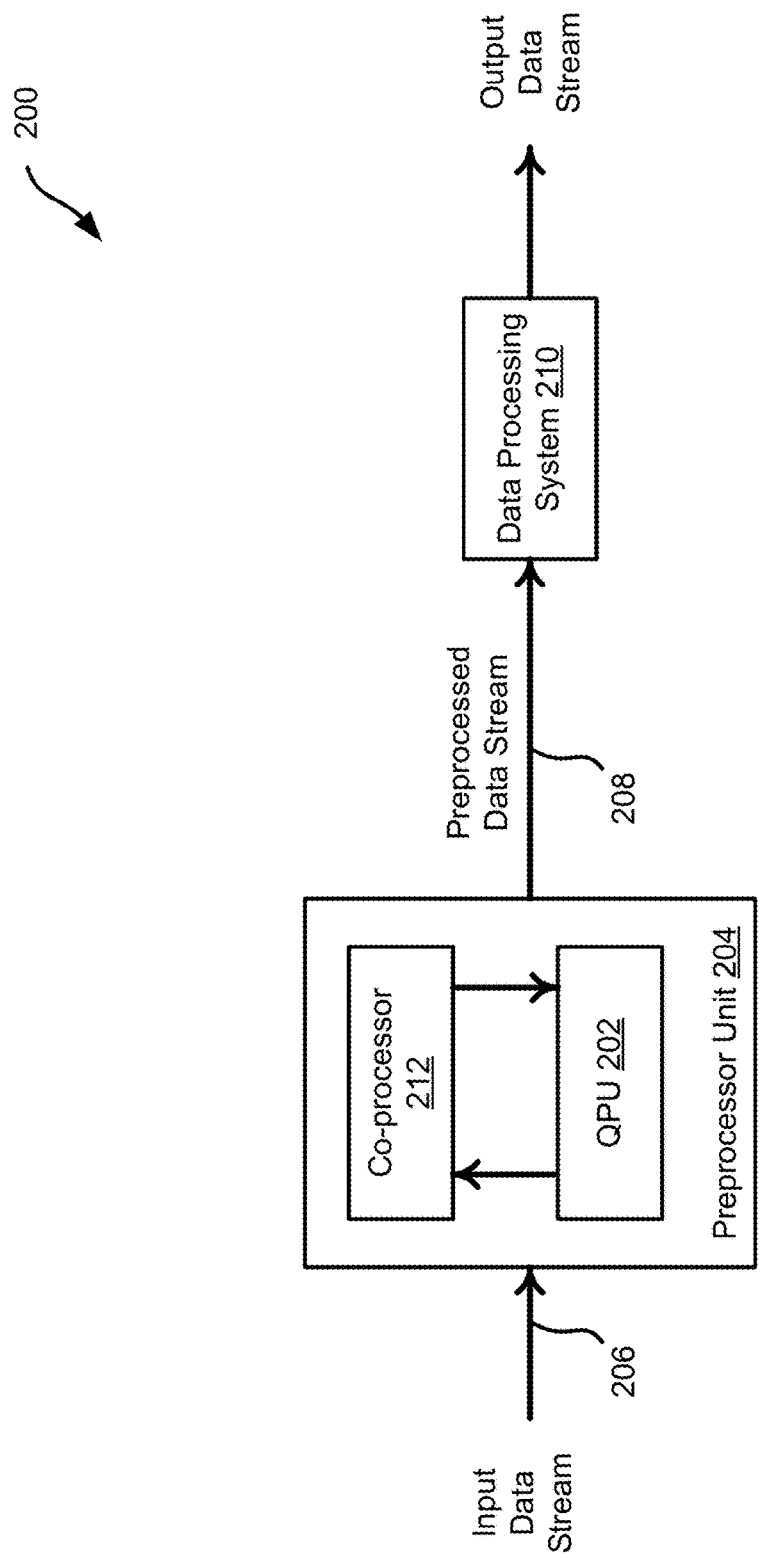
FIG. 2 is a schematic diagram of an example computing system that uses a QPU to preprocess data.

FIG. 2 is a schematic diagram of an example computer system 200 that uses a quantum processor unit (QPU) 202 to preprocess data. The example computer system 200 includes a preprocessor unit 204 and a data processing system 210. The elements of the computer system 200 can be implemented, for instance, as elements in the example computing environment 101 or in another manner. As an example, the preprocessor unit 204 can be implemented as the quantum processor unit 103A, and the data processor system 210 can be implemented as one or more of the access nodes 110 or other computing resources 107. The computer system 200 may include additional or different features.

The quantum processor unit 202 is part of a preprocessor unit 204 that is operable to receive an input data stream 206 and generate a preprocessed data stream 208 for the data processing system 210. The preprocessor unit 204 also includes a co-processor 212 that communicates with the quantum processor unit 202. For instance, the co-processor 212 may be implemented as the controllers 106A or the server 108 in FIG. 1 or in another manner. In some examples, the co-processor 212 is operable to receive the input data stream 206 and define control parameters for the QPU 202 based on the input data stream 206. For instance, the co-processor 212 may parameterize quantum logic gates to be applied to input qubits (e.g., as part of the example quantum logic circuit 500 shown in FIG. 5) or another type of control sequence. The preprocessor unit 204 may include additional or different features and components.

In some aspects, the example computer system 200 represents a hybrid computer system that includes both classical and quantum information processing capabilities. For instance, the preprocessor unit 204 may be configured to process quantum information (e.g., by operation of the quantum processor unit 202), and the data processor system 210 may be configured to process classical information (e.g., by operation of a digital microprocessor, digital logic circuitry, or another type of classical data processor). In some implementations, the data processor system 210 can be or include another quantum processor unit, and the data processor system 210 may receive classical or quantum information from the preprocessor unit 204.

The input data stream 206 may represent information to be processed by a machine learning algorithm or another type of computer application executed by the data processing system 210. For instance, the input data stream 206 may represent a stream of data sets to be classified or otherwise analyzed over time. In some cases, the input data stream has a structured time dependence. For example, the input data stream may include a time series of data sets that correspond to time intervals. For instance, the input data stream may include video data (where each data set can include one or more video frames), market data (where each data set can include stock prices or trading volume for an hour or day), meteorological data (where each data set can include temperatures or pressure measurements for an hour or day), etc.

The preprocessor unit 204 acts upon the information in the input data stream to produce the preprocessed data stream 208, which is supplied to the data processor system 210. For example, the preprocessed data stream 208 may be communicated to the data processor system 210 over a remote data connection (e.g., a network or other remote connection) or a local data connection (e.g., a data bus or other local connection). In producing the preprocessed data stream 208, the co-processor 212 may operate the QPU 202 as a quantum streaming kernel that can be repeatedly updated with each new data set in the input data stream 206. For example, a new portion of the output data stream time series can be produced for each new data set in the input data stream time series.

In some cases, the preprocessor unit 204 realizes a quantum streaming kernel using a system of coupled quantum devices (e.g., superconducting transmon qubits, trapped ions, etc.) that are periodically driven (or otherwise continually affected) by control signals based on the input data stream 206. The control signals, which themselves encode a stream of information, may represent sensor data, a computer generated time series, video or audio streams, quantum signals generated via interaction with another quantum system, or other types of data streams. Accordingly, the quantum streaming kernel may, in some instances, function as server that processes an input stream into an output stream, and which may be embedded into a larger processing workflow.

In some aspects of operation, the preprocessor unit 204 performs all or part of an iterative process, for example, executing a new iteration of a quantum streaming kernel process for each new data set received in the input data stream 206. For instance, each iteration of the quantum streaming kernel may include reading an input data set for the iteration (e.g., from a socket that is written to by an access node), preprocessing the input data set (e.g., by operation of the co-processor 212), applying a quantum logic circuit based on preprocessed input data set (e.g., by operation of the QPU 202), measuring a subset of qubits in the QPU 202, processing the measurements (e.g., by operation of the co-processor 212), providing the processed measurement data as output (writing to an output socket that is available to an access node), and providing feedback from output to input. For instance, the iterative process may be implemented as described with respect to FIG. 4 or in another manner.

Figure 3A:
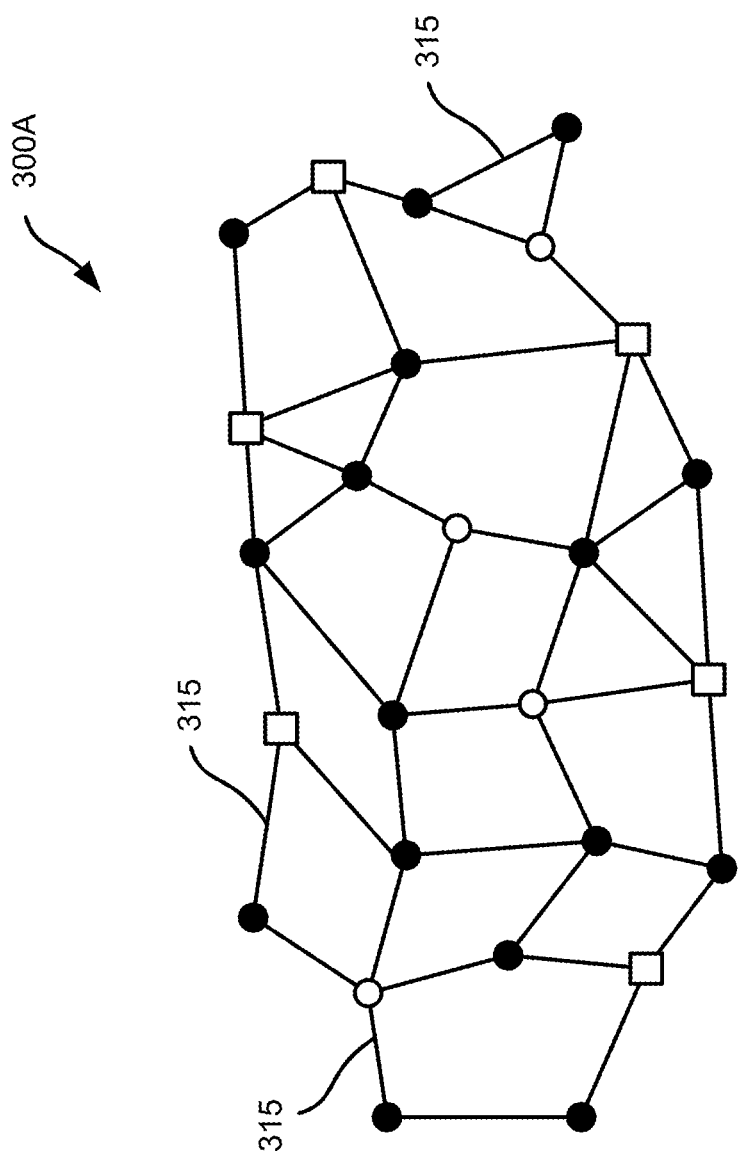
FIG. 3A is a schematic diagram showing attributes of an example quantum resource.
Figure 3A:
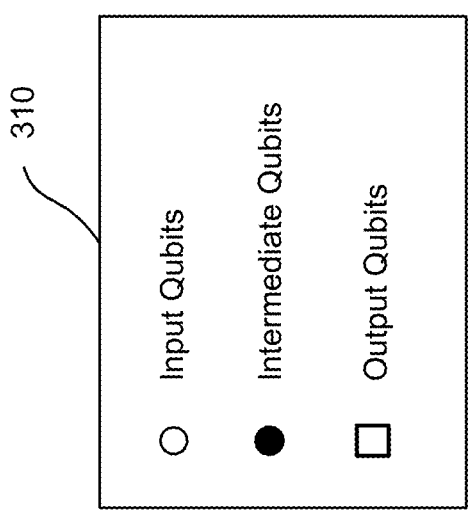
Figure 3B:
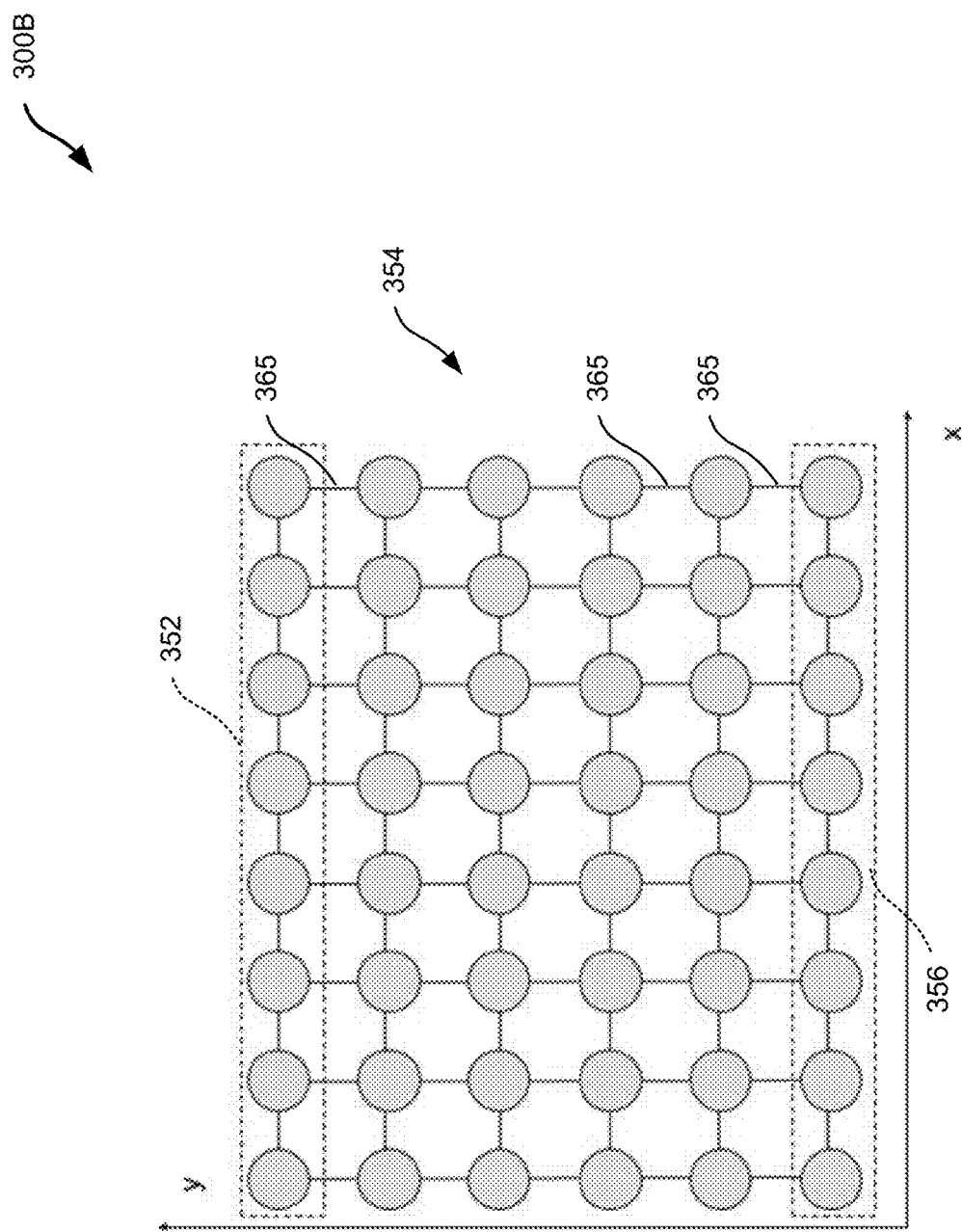
FIG. 3B is a schematic diagram showing attributes of an example quantum processor cell.

In some cases, components (e.g., qubit devices) or groups of components of the QPU 202 can be designated input nodes, compute nodes, memory nodes, output nodes, or other types of nodes, and each node may have a designated function when the QPU 202 executes the quantum streaming kernel process. For instance, in some examples, the information encoding control signal affects only operations applied to the input nodes, and quantum measurement are performed exclusively over the output nodes. FIGS. 3A and 3B show examples of how qubit devices could be partitioned into input nodes, compute nodes, and output nodes. The components of the QPU 202 may be assigned additional or different functions in the context of a quantum streaming kernel. By ensuring that not all nodes are measured, quantum coherence can persist over many measurements, and the internal QPU state may depend sensitively on the history of received input data stream 206. Even beyond the quantum coherence time of the QPU, the QPU may have an extended classical memory time scale over which it will retain certain features of past inputs.

FIG. 3A is a schematic diagram showing attributes of an example quantum resource 300A. The example quantum resource 300A can be used in a quantum computing system to store and process quantum information. For example, the quantum resource 300A may represent qubits in a quantum processor unit (QPU), a quantum virtual machine (QVM) or another type of quantum resource. In some cases, the quantum resource 300A executes all or part of a quantum streaming kernel process.

The example quantum resource 300A shown in FIG. 3A includes a collection of qubits. The qubits (represented by circles and squares in FIG. 3A) can be implemented, for example, in a superconducting integrated quantum circuit, in a spin system, in a trapped ion system, or in another type of quantum system. The example quantum resource 300A also includes connections 315 between pairs of the devices. The connections 315 can be implemented, for example, as capacitive connections, optical connections, or other types of mechanism that mediate between qubits in a quantum system. In the example shown in FIG. 3A, each connection 315 between a pair of qubits provides a link for applying a two-qubit quantum logic gate (e.g., an entangling gate) to the pair of qubits. The example qubits shown in FIG. 3A may be deployed in a variety of physical arrangements (e.g., as a lattice, graph, or any type of array, in one or more devices, etc.). In some cases, each qubit is connected to one or more of its neighboring qubits, or to one or more distant qubits, in a one-dimensional, two-dimensional or three-dimensional array of qubits.

FIG. 3A includes a legend 310 that indicates three types of qubits in the quantum resource 300A in FIG. 3A: input qubits (represented by open circles), intermediate qubits (represented by filled circles), and output qubits (represented by squares). In some cases, the input qubits can operate as an input node of a quantum streaming kernel, and the output qubits can operate as an output node of the quantum streaming kernel. As shown in FIG. 3A, the intermediate qubits connect the input qubits to the output qubits in the quantum resource 300A. The input and intermediate qubits may operate, for example, as a memory for the recent history of past input signals to the quantum streaming kernel.

In some aspects, when the quantum resource 300A operates as a quantum streaming kernel, quantum logic gates can be executed based on each new portion of data in an input data stream; the quantum logic gates can then be applied to the input qubits; multi-qubit quantum logic gates can then be applied to various combinations of the input qubits, the intermediate qubits and the output qubits; and the output qubits can then be measured. In this manner, the input qubits and the intermediate qubits in the quantum resource 300A can maintain a coherent quantum state through each measurement, which can preserve historical information from the input data stream that has been processed by the quantum streaming kernel.

FIG. 3B is a schematic diagram showing attributes of an example quantum processor cell 300B. The example quantum processor cell 300B shown in FIG. 3B is an example implementation of the quantum resource 300A shown in FIG. 3A, which can be used in a quantum computing system to store and process quantum information, for example, in a quantum processor unit (QPU) or another type of system. For instance, the quantum processor cell 300B can operate as the quantum processor cells 102A, 102B shown in FIG.

1. In some cases, the quantum processor cell 300B executes all or part of a quantum streaming kernel process.

The example quantum processor cell 300B shown in FIG. 3B includes a two-dimensional array of qubit devices. The qubit devices (represented by circles in FIG. 3B) can be implemented, for example, as transmon qubit devices in a superconducting integrated quantum circuit, or other types of qubit devices. The example quantum processor cell 300B also includes connections 365 between each neighboring pair of the qubit devices. The connections 365 can be implemented, for example, as capacitive connections between transmon qubit devices in a superconducting integrated quantum circuit. In the example shown in FIG. 3B, the connection 365 between a neighboring pair of qubit devices provides a link for applying a two-qubit quantum logic gate (e.g., an entangling gate) to the pair of qubit devices.

FIG. 3B shows a vertical y-axis and a horizontal x-axis representing respective spatial dimensions in the quantum processor cell 300B. As shown in FIG. 3B, one row of the qubit devices in the quantum processor cell 300B is identified as an output layer 352, and another row of the qubit devices in the quantum processor cell 300B is identified as an input layer 356. In some cases, the input layer 356 of qubit devices can operate as an input node of a quantum streaming kernel, and the output layer 352 of qubit devices can operate as an output node of the quantum streaming kernel. As shown in FIG. 3B, four intermediate layers 354 of the qubit devices in the quantum processor cell 300B connect the input layer 356 to the output layer 352. A quantum logic circuit applied to the qubit devices can include multi-qubit gates that generate entanglement between the input row and the intermediate rows, as well as multi-qubit gates that generate entanglement between the intermediate rows and the output row. The intermediate layers 354 may operate, for example, as a memory for the recent history of past input signals to the quantum streaming kernel.

In some implementations, the quantum processor cell 300B can include a three-dimensional array of qubit devices. For instance, the quantum processor cell 300B may include a three-dimensional stack that extends in a third spatial dimension (out of the xy-plane shown in FIG. 3B). In such cases, some or all of the layers shown in FIG. 3B (the input layer, the output layer, or an intermediate layer) can extend into the third spatial dimension of the quantum processor cell 300B, for example, and include additional qubit devices in other planes of the three-dimensional stack. Accordingly, the various nodes or domains of a quantum streaming kernel can be defined in, and may include qubit devices distributed over, two or three spatial dimensions of the quantum processor cell 300B.

In some aspects, when the quantum processor cell 300B operates as a quantum streaming kernel, quantum logic gates can be parameterized based on each new data set in an input data stream; the parameterized quantum logic gates can then be applied to the input node (the input layer 356 of qubit devices); entangling gates can then be applied between the input node and the output node (the output layer 352 of qubit devices); and the output node can then be measured, for example, by measuring each qubit device in the output layer 352 of the quantum processor cell 300B. In this manner, the input layer 356 and the intermediate layers 354 in the quantum processor cell 300B can maintain a coherent quantum state after each measurement, which can preserve information from data sets that have been processed by the quantum streaming kernel.

Figure 4:
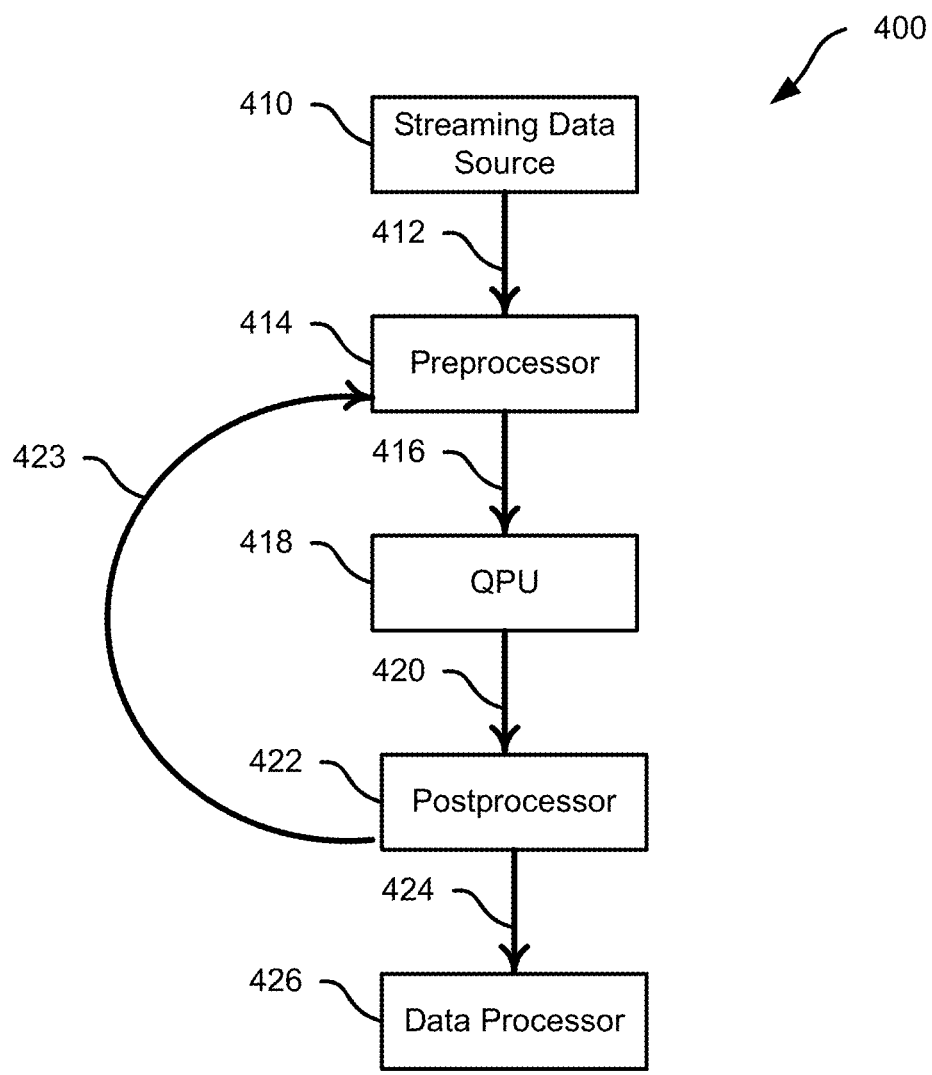
FIG. 4 is a schematic diagram of an example computing system that uses a QPU as a streaming kernel.

FIG. 4 is a schematic diagram of an example computing system 400 that uses a QPU as a quantum streaming kernel. The example computing system 400 shown in FIG. 4 includes a streaming data source 410, a preprocessor 414, a quantum processor unit (QPU) 418, a postprocessor 422 and a data processor 426. The example computing system 400 also includes communication links 412, 416, 420, 423, 424 that allow data to be communicated between components of the computing system 400. The computing system 400 may include additional or different features, and the components may be arranged or configured in another manner.

In the example shown in FIG. 4, the streaming data source 410 obtains data from an environment that is evolving in time. For example, the streaming data source 410 can include sensors, data connections, data logs, input devices, or other types of computer system elements that obtain data from an external environment over time. The external environment be or include, for instance, stock markets, cameras or microphones, antenna systems or radio frequency sensors, another type of a sensor or logging mechanism that monitors a natural or engineered system. In some cases, the streaming data source 410 is provided by an access node (e.g., one of the access nodes 110 shown in FIG. 1) in a computer system. In some aspects of operation, the streaming data source 410 can provide a continual stream of raw input data to the preprocessor 414.

The example preprocessor 414 can receive the stream of raw input data from the streaming data source 410 over the communication link 412. The example preprocessor 414 may also receive feedback data from the postprocessor 422 over the communication link 423. In some cases, the preprocessor 414 is provided by a classical preprocessor or encoder (e.g., the co-processor 212 shown in FIG. 2) in a computer environment. In some aspects of operation, the preprocessor 414 can preprocess the raw input data and provide a continual stream of preprocessed input data to the QPU 418.

The example QPU 418 can receive the stream of preprocessed input data from the preprocessor 414 over the communication link 416. In some cases, the QPU 418 is a quantum computing resource in a larger computing environment (e.g., the example computing environment 101), and may operate as a quantum streaming kernel. In some aspects of operation, the QPU 418 can apply a quantum logic circuit that interacts input signals with memory qubits and memory qubits with output qubits, and the QPU 418 can provide a continual stream of raw measurements of outputs to the postprocessor 422.

The example postprocessor 422 can receive the stream of raw measurements of outputs from the QPU 418 over the communication link 420. In some cases, the postprocessor 422 is a classical postprocessor (e.g., the data processing system 210 shown in FIG. 2) in a computer system. In some aspects of operation, the postprocessor 422 can provide feedback data to the preprocessor 414. For example, the postprocessor 422 may provide delayed or instantaneous self-feedback of useful output features or other types of information to the preprocessor 414. In some aspects of operation, the postprocessor 422 can provide a continual output stream to the data processor 426. For example, the postprocessor 422 may provide anomaly flags, classification labels, predictions of next input signals (e.g., forecasting) or other types of output.

The example data processor 426 can receive the stream of output data from the postprocessor 422 over the communication link 424. In some cases, the data processor 426 is provided by an access node (e.g., one of the access nodes 110 shown in FIG. 1) in a computer environment. In some aspects of operation, the data processor 426 processes the output from the postprocessor 422.

In an example aspect of operation, the streaming data source 410 provides an input signal stream that contains time varying information that can be efficiently encoded as a n-dimensional real valued input vector of bounded magnitude. In some cases, one such input vector is provided per time step, where time may range from some start time t=0 to an arbitrarily long time (i.e., the program can in principle run forever). The input vector at time t may be represented as D(t). As an example, the streaming data source 410 can be a camera system that provides one or more video frames per time step, and the input vector for each time step contains information from the one or more video frames. In some cases, the computing environment that hosts the QPU 418 may provide a network socket to the streaming data source 410, so that input data for each time step can be written directly to that socket.

In an example aspect of operation, the preprocessor 414 may then apply an embedding/encoding transformation that maps the input vector D(t) to the input parameters u(t) of an update quantum logic circuit U(u(t); p). This mapping could be given by a randomly sampled one, for example, u(t)=R D(t)+b(t), or otherwise.

In an example aspect of operation, the QPU 418 then applies the parameterized, update quantum logic circuit U(u(t); p) to the current quantum state of the QPU 418, which in general will depend on the recent history of prior input signals. The update quantum logic circuit U(u(t); p) can be the example quantum logic circuit shown in FIG. 5 or another type of circuit. Here p is given by an additional set of static hyper-parameters that are not changed at each time step. The quantum logic circuit may be configured to ensure that the input information affects the QPU state and distributes the information among the QPU's qubits. In particular, the update quantum logic circuit can be configured to transfer information about the internal QPU state to the output qubits. Output qubits of the QPU 418 are measured in each time step and their measurement results (as well as perhaps some fixed Boolean expressions of these results) are concatenated to form the measurement vector at time t: m(t).

In an example aspect of operation, the postprocessor 422 postprocesses the measurement vector at time t to produce the output signal y(t). For example, y(t) might be given by a linear transformation of m(t) or by some other parameterized transform. This transformation may be optimized to extract a useful output, e.g., a flag to indicate an anomalous input pattern, a classifier label, a prediction for (components of) the next input signal. Depending on the use case, this mapping may be learned through a supervised or unsupervised training method. In some cases, one may use unsupervised methods such as Slow Feature Analysis to have the quantum streaming kernel itself identify interesting features in the input data.

In an example aspect of operation, the output signal y(t) can be provided back to the access node, e.g., by writing to an output network socket that the access node can subscribe to. In some cases, there may be immediate (or delayed by T timesteps) feedback from the output stream to the input stream, such that the encoded inputs are a function of both the current input D(t) and the output y(t-T). By feeding back classically processed output signals that have been found to provide useful information (e.g., they are good predictors of the recent signal pattern type or of a recently occurred anomaly) to the input signal, the performance of the overall system can be further enhanced. By adding classical postprocessing (e.g., a linear transformation) to the output signal, one can implement fairly general and useful functions of the input signal history.

In some implementations, one or more of the communication links in FIG. 4 are low-latency links. For instance, the communication links 416, 420 and 423 can be configured to maximize the amount of data that can be processed during the coherence time of the QPU 418. In some cases, the communication link 423 is configured to communicate feedback from the postprocessor 422 to the preprocessor 414 within a characteristic coherence time of the QPU 418, for example, so that a coherent state is preserved in the QPU 418 between feedback iterations.

In some cases, preprocessing or postprocessing (or both) are performed in a cryogenic environment in the computing system 400. For example, the preprocessor 414 or the postprocessor 422 (or both) can be implemented on classical electronics housed inside a cryostat that provides a cryogenic environment for the qubit devices of the QPU 418. In some cases, such arrangements can improve the speed and accuracy (to reduce loss and latency) of feedback to the QPU 418 or connections between quantum streaming kernels.

In an example aspect of operation, a random input signal encoding is fixed, and randomized entangling interactions (e.g., two-qubit gates) are implemented on compute/memory nodes of the QPU 418, and only the classical output transformation is adapted in order to extract useful information (and therefore computation) from the quantum system. In some cases, one could realize such a system on a quantum computer, even a noisy intermediate-scale quantum (NISQ) computer.

Figure 5:
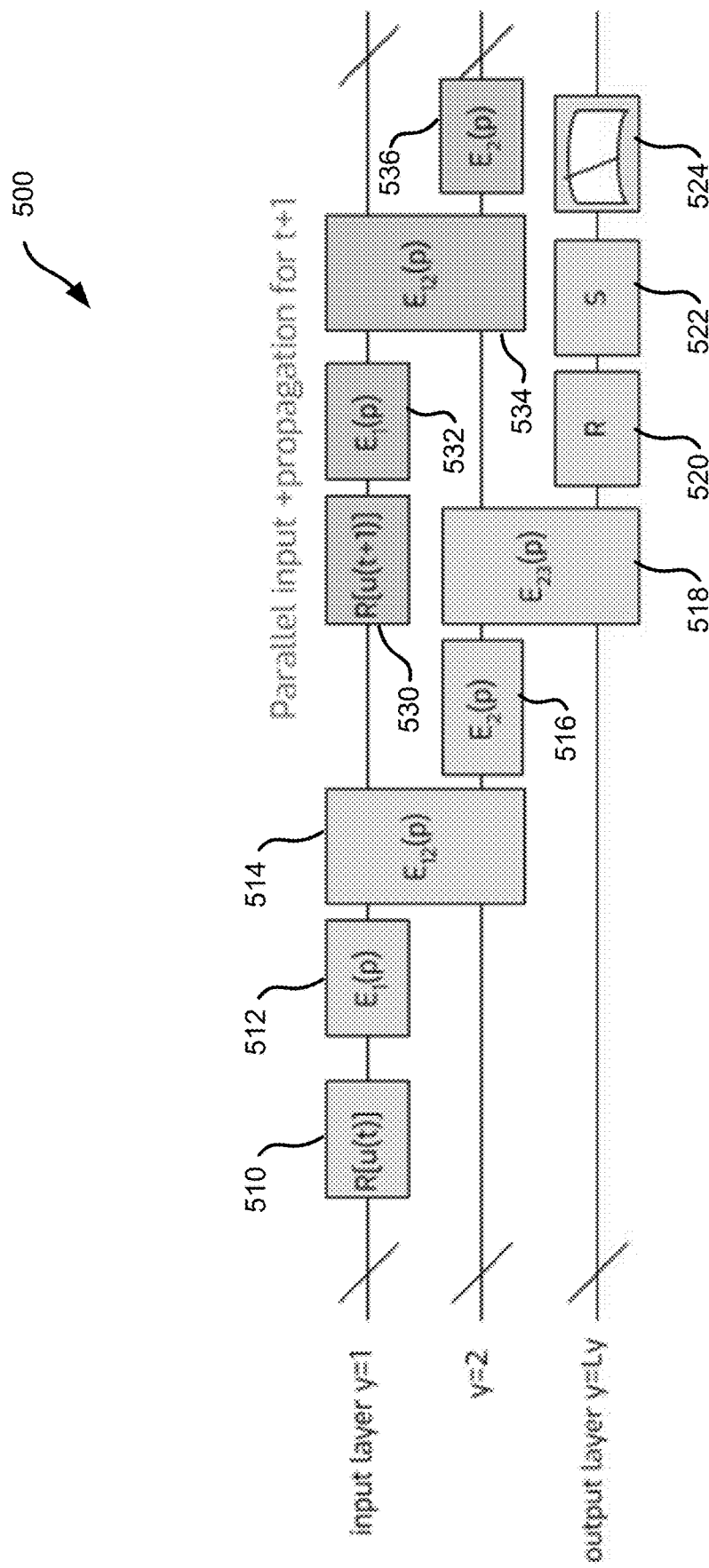
FIG. 5 is a diagram of an example quantum logic circuit.

FIG. 5 is a diagram of an example quantum logic circuit 500. The example quantum logic circuit 500 as shown in FIG. 5 includes quantum logic gates for multiple time steps of a quantum streaming kernel process. In particular, quantum logic gates 510, 512, 514, 516, 518, 520, 522, 524 form a quantum logic circuit that applies an update map for one time step (t), and quantum logic gates 530, 532, 534, 536 form part of the quantum logic circuit that applies the update map for the next time step (t+1).

The example quantum logic circuit 500 includes a sequence of control steps where inputs are encoded as quantum gate parameters affecting qubits in an input node (at 510). Entangling interactions (at 512, 514, 516, 518) then propagate the input information through intermediate qubits to output qubits in the quantum processor. At every time step, some qubits are measured to extract an output signal (at 524).

The top row of the quantum logic circuit 500 shows operations applied to an input node of a quantum streaming kernel (e.g., the input qubits shown in FIG. 3A or the input layer 356 shown in FIG. 3B). At 510, quantum logic rotations parameterized by a data set from the input stream are applied to the qubit devices in the input node. At 512, encoding operations are applied to the qubit devices within the input node.

The middle row of the quantum logic circuit 500 shows operations applied to a compute node of the quantum streaming kernel (e.g., the intermediate qubits shown in FIG. 3A or the intermediate layers 354 shown in FIG. 3B). At 514, 516, and 518 encoding operations are applied over the compute node. At 514, a set of multi-qubit quantum logic gates couple the qubit devices in the input node with one or more of the qubit devices in the compute node. At 516, encoding operations are applied to the qubit devices within the compute node. At 518, another set of multi-qubit quantum logic gates couple one or more of the qubit devices in the compute node with the qubit devices in the output node.

The bottom row of the quantum logic circuit 500 shows operations applied to an output node of the quantum streaming kernel (e.g., the output qubits shown in FIG. 3A or the output layer 352 shown in FIG. 3B). At 520 and 522 (which may be combined into a single operation) one or more operations that prepare the output node for measurement are applied; and at 524, each qubit device in the output node is measured. For example, each qubit device in the output node may be projectively measured to obtain a raw output bit string.

In some cases, the quantum logic circuit 500 can be reconfigured as a single control operation that is parameterized by u(t) and applied over all qubits, followed by measurement (at 524) of the output layer. For instance, operations 510, 512, 514, 516, 518, 520, 522 can be replaced by a single control step that is applied over the input node, the compute node, and the output node.

The example quantum logic circuit 500 may be deployed as the update map U(u(t); p) in a quantum streaming kernel, as described above. Over many time steps t=0, 1, 2, 3, . . . , the sequence of operations (as it pertains to the quantum system) can be described as an iterative process:

1. Prepare u(0) as described above
   Execute U(u(0); p)
   Measure output bits to produce m(0) and process this vector as described above
2. Prepare u(1) as described above
   Execute U(u(1); p)
   Measure output bits to produce m(1) and process this vector as described above
3. Prepare u(2) as described above
   Execute U(u(2); p)
   Measure output bits to produce m(2) and process this vector as described above
4. Continue . . . .

The quantum logic circuit may be used or deployed in another manner.

Some of the subject matter and operations described in this specification can be implemented in digital electronic circuitry, or in computer software, firmware, or hardware, including the structures disclosed in this specification and their structural equivalents, or in combinations of one or more of them. Some of the subject matter described in this specification can be implemented as one or more computer programs, i.e., one or more modules of computer program instructions, encoded on a computer storage medium for execution by, or to control the operation of, data-processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (e.g., multiple CDs, disks, or other storage devices).

Some of the operations described in this specification can be implemented as operations performed by a data processing apparatus on data stored on one or more computer-readable storage devices or received from other sources.

The term "data-processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program, or in multiple coordinated files (e.g., files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read-only memory or a random-access memory or both. Elements of a computer can include a processor that performs actions in accordance with instructions, and one or more memory devices that store the instructions and data. A computer may also include, or be operatively coupled to receive data from or transfer data to, or both, one or more mass storage devices for storing data, e.g., magnetic disks, magneto optical disks, or optical disks. However, a computer need not have such devices. Moreover, a computer can be embedded in another device, e.g., a phone, an electronic appliance, a mobile audio or video player, a game console, a Global Positioning System (GPS) receiver, or a portable storage device (e.g., a universal serial bus (USB) flash drive). Devices suitable for storing computer program instructions and data include all forms of non-volatile memory, media and memory devices, including by way of example semiconductor memory devices (e.g., EPROM, EEPROM, flash memory devices, and others), magnetic disks (e.g., internal hard disks, removable disks, and others), magneto optical disks, and CD ROM and DVD-ROM disks. In some cases, the processor and the memory can be supplemented by, or incorporated in, special purpose logic circuitry.

To provide for interaction with a user, operations can be implemented on a computer having a display device (e.g., a monitor, or another type of display device) for displaying information to the user and a keyboard and a pointing device (e.g., a mouse, a trackball, a tablet, a touch sensitive screen, or another type of pointing device) by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

A computer system may include a single computing device, or multiple computers that operate in proximity or generally remote from each other and typically interact through a communication network. Examples of communication networks include a local area network ("LAN") and a wide area network ("WAN"), an inter-network (e.g., the Internet), a network comprising a satellite link, and peer-to-peer networks (e.g., ad hoc peer-to-peer networks). A relationship of client and server may arise by virtue of computer programs running on the respective computers and having a client-server relationship to each other.

In some aspects of what is described above, a computer system processes a data stream. The computer system may include a lattice, or graph, of connected qubits in which a subset of the qubits can be measured without measuring the other qubits in the lattice, or graph, (e.g., the output qubits can be measured without measuring input qubits or intermediate qubits). In addition, the qubits in the lattice, or graph, can be manipulated simultaneously, for example, by applying a quantum logic circuit to the connected qubits. The lattice, or graph, of qubits may be implemented, for example, as a one-dimensional array (e.g., with long-range coupling between non-adjacent qubits), a two-dimensional array, a three-dimensional array, or another type of lattice, or graph, (e.g., an unstructured lattice or graph).

In some aspects of what is described above, by measuring the output qubits while preserving a coherent state of the other qubits, memory effects in the input data stream can be retained in the coherent state of the quantum processor. For instance, the computer system may be used in conjunction with a time series analysis, to analyze a time series of data that has non-trivial memory effects. For example, the time series can include market data (e.g., stock prices, commodity prices, etc.), meteorological data (e.g., local weather, etc.), chaotic sequences or other types of data that may have time-dependent or time-correlated properties.

Accordingly, the memory time of the quantum processor may be configured to preserve memory effects of the input data stream. For example, the system may be engineered such that the coherence time is longer than the time between data sets or longer than a memory effect in the input data stream. In some implementations, the streaming computation may persist much longer than the coherence time of the quantum processor (in principle indefinitely) while processing the stream. In some example quantum processors, the memory time can be engineered by changing the lattice, or graph, and the distance between the input nodes and the output nodes, and the memory time can be engineered to be below the coherence time.

In a general aspect, a quantum processor is used to process a stream of data.

In a first example, a computer system includes one or more classical processors, a quantum resource (e.g., one or more quantum processors, quantum virtual machines, etc.) and memory. The quantum resource defines input qubits, intermediate qubits, and output qubits. The memory stores instructions that cause the one or more classical processors to perform operations comprising parameterizing quantum logic gates based on input data; obtaining an output produced by the quantum resource executing a quantum logic circuit; and generating preprocessed data based on the output. Executing the quantum logic circuit includes applying the parameterized quantum logic gates to the input qubits; applying multi-qubit quantum logic gates that couple the input qubits with one or more of the intermediate qubits; applying multi-qubit quantum logic gates that couple one or more of the intermediate qubits with the output qubits; and measuring the output qubits to obtain the output.

Implementations of the first example may include one or more of the following features. The operations may include performing an iterative process. Each iteration of the iterative process may include: obtaining an input data set for the iteration; parameterizing the quantum logic gates for the iteration based on the input data set for the iteration; and obtaining, from the quantum resource, an output data set for the iteration based on an execution of the quantum logic circuit having the quantum logic gates parameterized for the iteration. The operations may include receiving an input data stream from a remote source; obtaining the input data set for each iteration from the input data stream; generating an output data stream comprising the output data set for each iteration; and providing the output data stream as an input for a computer process. The quantum resource may maintain a coherent state of the input qubits and the intermediate qubits between consecutive iterations of the iterative process. One or more of the iterations may include obtaining an input data set for the iteration; obtaining an output data set from a prior iteration; and parameterizing the quantum logic gates for the iteration based on the input data set for the iteration and the output data set from the prior iteration. Each iteration may include applying, to the input qubits, the quantum logic gates parameterized for the iteration applying the multi-qubit quantum logic gates that couple the input qubits with one or more of the intermediate qubits; applying the multi-qubit quantum logic gates that couple one or more of the intermediate qubits with the output qubits; and applying a set of measurement operations to the output qubits.

Implementations of the first example may include, for example, one or more of the following features. The parameterized quantum logic gates can be single-qubit rotation gates, and parameterizing the quantum logic gates can include defining rotation angles of the respective single-qubit rotation gates. The quantum logic gates can be controlled-phase gates, and parameterizing the quantum logic gates can include defining phases of the respective controlled-phase gates.

Implementations of the first example may include one or more of the following features. Applying the multi-qubit quantum logic gates that couple the input qubits with one or more of the intermediate qubits may include applying a first set of two-qubit entangling gates. Each of the first set of two-qubit entangling gates can be applied to a respective pair of qubits that include one of the input qubits and one of the intermediate qubits. Applying the multi-qubit quantum logic gates that couple one or more of the intermediate qubits with the output qubits can include applying a second set of two-qubit entangling gates. Each of the second set of two-qubit entangling gates can be applied to a respective pair of qubits that includes one of the intermediate qubits and one of the output qubits.

Implementations of the first example may include one or more of the following features. Measuring the output qubits to obtain the output may include obtaining a bitstring representing a computational state of the output qubits, and the output data stream data may include the bitstring. Furthermore, the measurement can be a raw measurements, which raw measurement will be in the form of analog data. Executing the quantum logic sequence may include applying multi-qubit quantum logic gates that couple one or more of the intermediate qubits with other intermediate qubits. Executing the quantum logic sequence may include applying single-qubit quantum logic gates to one or more input qubits, intermediate qubits and output qubits.

Implementations of the first example may include one or more of the following features. The operations may include obtaining the input data for a computer process configured to receive an input; and providing the output data as the input for the computer process. The quantum resource may include an array of devices that has an input layer comprising qubit devices that define the input qubits, an intermediate layer comprising qubit devices that define the intermediate qubits; and an output layer comprising qubit devices that define the output qubits. The array can be a two-dimensional array. The input layer can be a first row of the qubit devices, the output layer can be a second row of the qubit devices, and the intermediate layer can be one or more other rows of the qubit devices between the first row and the second row. The array can be a three-dimensional array. The quantum resource can include an array of connected devices that can be controlled simultaneously and that defines the input qubits, the intermediate qubits and the output qubits. The output qubits can be measured without measuring the input qubits or the intermediate qubits.

In a second example, an input stream of data is converted to an output stream of data. The conversion includes repeatedly receiving a new portion of an input stream of data; encoding the new portion into an internal quantum state of a quantum processor; measuring part of the quantum state; and producing a new portion of the output stream based on the measurement. After each new portion of the input stream is encoded into the internal quantum state of a quantum processor, a first part of the internal quantum state is measured while the coherence of a second part of the internal quantum state of the quantum processor is maintained.

Implementations of the second example may include one or more of the following features. Maintaining the second part of the internal quantum state can preserve information from a history of the input stream of data. Each measurement can contain information based on the history of the input stream of data.

Implementations of the second example may include one or more of the following features. The quantum processor can include interconnected qubits that define the internal quantum state. Measuring the first part of the internal quantum state of the quantum processor while maintaining coherence of a second part of the internal quantum state of the quantum processor can include measuring a first subset of the interconnected qubits.

Implementations of the second example may include one or more of the following features. The input stream of data can have a structured time dependence. The input stream of data can include a time series of data sets, and each new portion of the input stream of data can include one or more new data sets from the time series. The coherence time of the internal quantum state can be longer than a time between data sets in the time series.

Implementations of the second example may include one or more of the following features. Converting the input stream to the output stream can include preprocessing the input stream. The output stream of data can be provided as an input for a computing process. Converting the input stream to the output stream can include encoding each new portion of the input stream into the internal state of the quantum processor by: parameterizing quantum logic gates based on the new portion of the input stream of data; and executing a quantum logic circuit on the quantum processor. The quantum processor may define input qubits, intermediate qubits, and output qubits. Executing the quantum logic circuit may include applying the parameterized quantum logic gates to the input qubits; applying multi-qubit quantum logic gates that couple the input qubits with one or more of the intermediate qubits; and applying multi-qubit quantum logic gates that couple one or more of the intermediate qubits with the output qubits. Measuring the first part of the internal quantum state of the quantum processor while maintaining the second part of the internal quantum state of the quantum processor may include, after executing the quantum logic circuit, measuring the output qubits without measuring the input qubits or the intermediate qubits.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:
1. A method comprising:
obtaining input data for a computer process configured to receive an input;
by operation of one or more classical processors, parameterizing quantum logic gates based on the input data;
executing a quantum logic circuit on a quantum resource, wherein the quantum resource defines input qubits, intermediate qubits, and output qubits, and executing the quantum logic circuit comprises:
applying the parameterized quantum logic gates to the input qubits;

applying multi-qubit quantum logic gates that couple the input qubits with one or more of the intermediate qubits;
applying multi-qubit quantum logic gates that couple one or more of the intermediate qubits with the output qubits; and
measuring the output qubits to obtain an output of the quantum logic circuit;
generating output data based on the output of the quantum logic circuit; and
providing the output data as the input for the computer process.

2. The method of claim 1, comprising executing multiple iterations of an iterative process, wherein each iteration comprises:
obtaining an input data set for the iteration;
parameterizing the quantum logic gates for the iteration based on the input data set for the iteration;
executing, on the quantum resource, the quantum logic circuit comprising the quantum logic gates parameterized for the iteration; and
generating an output data set for the iteration based on the execution of the quantum logic gates parameterized for the iteration.

3. The method of claim 2, comprising:
receiving an input data stream from a remote source;
obtaining the input data set for each iteration from the input data stream;
generating an output data stream comprising the output data set for each iteration; and
providing the output data stream as the input for the computer process.

4. The method of claim 2, wherein the quantum resource maintains a coherent state of the input qubits and the intermediate qubits between consecutive iterations of the iterative process.

5. The method of claim 2, wherein one or more of the iterations comprises:
obtaining an input data set for the iteration;
obtaining an output data set from a prior iteration; and
parameterizing the quantum logic gates for the iteration based on the input data set for the iteration and the output data set from the prior iteration.

6. The method of claim 2, wherein each iteration comprises:
applying, to the input qubits, the quantum logic gates parameterized for the iteration;
applying the multi-qubit quantum logic gates that couple the input qubits with one or more of the intermediate qubits;
applying the multi-qubit quantum logic gates that couple one or more of the intermediate qubits with the output qubits; and
applying a set of measurement operations to the output qubits.

7. The method of claim 1, wherein the parameterized quantum logic gates comprise single-qubit rotation gates, and parameterizing the quantum logic gates comprises defining rotation angles of the respective single-qubit rotation gates.

8. The method of claim 1, wherein the quantum logic gates comprise controlled-phase gates, and parameterizing the quantum logic gates comprises defining phases of the respective controlled-phase gates.

9. The method of claim 1, wherein:
applying the multi-qubit quantum logic gates that couple the input qubits with one or more of the intermediate qubits comprises applying a first set of two-qubit entangling gates, each of the first set of two-qubit entangling gates being applied to a respective pair of qubits comprising one of the input qubits and one of the intermediate qubits; and
applying the multi-qubit quantum logic gates that couple one or more of the intermediate qubits with the output qubits comprises applying a second set of two-qubit entangling gates, each of the second set of two-qubit entangling gates being applied to a respective pair of qubits comprising one of the intermediate qubits and one of the output qubits.

10. The method of claim 1, wherein measuring the output qubits to obtain an output of the quantum logic circuit comprises obtaining a bitstring representing a computational state of the output qubits, and the output data comprises the bitstring.

11. The method of claim 1, wherein measuring the output qubits to obtain an output of the quantum logic circuit comprises obtaining a raw measurement comprising analog data.

12. The method of claim 1, wherein executing the quantum logic circuit comprises:
applying multi-qubit quantum logic gates that couple one or more of the intermediate qubits with other intermediate qubits; and
applying single-qubit quantum logic gates to the input qubits, the intermediate qubits, and the output qubits.

13. A computer system comprising:
one or more classical processors;
one or more quantum processors that define input qubits, intermediate qubits, and output qubits; and
memory storing instructions that, when executed by the one or more classical processors, cause the one or more classical processors to perform operations comprising:
parameterizing quantum logic gates based on input data;
obtaining an output produced by the one or more quantum processors executing a quantum logic circuit, wherein executing the quantum logic circuit comprises:
applying the parameterized quantum logic gates to the input qubits;
applying multi-qubit quantum logic gates that couple the input qubits with one or more of the intermediate qubits;
applying multi-qubit quantum logic gates that couple one or more of the intermediate qubits with the output qubits; and
measuring the output qubits to obtain the output; and
generating output data based on the output of the quantum logic circuit.

14. The computer system of claim 13, wherein the operations comprising:
obtaining the input data for a computer process configured to receive an input; and
providing the output data as the input for the computer process.

15. The computer system of claim 13, wherein the one or more quantum processors comprises an array of devices that includes:
an input layer comprising qubit devices that define the input qubits;
an intermediate layer comprising qubit devices that define the intermediate qubits; and
an output layer comprising qubit devices that define the output qubits.

16. The computer system of claim 15, wherein the array comprises a two-dimensional array, the input layer comprises a first row of the qubit devices, the output layer comprises a second row of the qubit devices and the intermediate layer comprises one or more rows of the qubit devices between the first row and the second row.

17. The computer system of claim 15, wherein the array comprises a three-dimensional array.

18. The computer system of claim 13, wherein the one or more quantum processors comprises an array of connected devices that can be controlled simultaneously and that defines the input qubits, the intermediate qubits and the output qubits, and wherein the output qubits can be measured without measuring the input qubits or the intermediate qubits.

19. A method comprising converting an input stream of data to an output stream of data by repeatedly:
receiving a new portion of the input stream of data;
after encoding the new portion into an internal quantum state of a quantum processor, measuring a first part of the internal quantum state of the quantum processor while maintaining coherence of a second part of the internal quantum state of the quantum processor; and
producing a new portion of the output stream of data based on the measurement of the first part of the internal quantum state.

20. The method of claim 19, wherein maintaining the coherence of the second part of the internal quantum state preserves information from a history of the input stream of data, and each measurement contains information based on the history of the input stream of data.

21. The method of claim 19, wherein the quantum processor comprises interconnected qubits that define the internal quantum state, and wherein measuring a first part of the internal quantum state of the quantum processor while maintaining coherence of a second part of the internal quantum state of the quantum processor comprises measuring a first subset of the interconnected qubits.

22. The method of claim 19, wherein the input stream of data has a structured time dependence.

23. The method of claim 22, wherein the input stream of data comprises a time series of data sets, and each new portion of the input stream of data comprises a new data set from the time series.

24. The method of claim 23, wherein a coherence time of the internal quantum state is longer than a time between data sets in the time series.

25. The method of claim 19, wherein converting the input stream to the output stream comprises preprocessing the input stream, and the method comprises providing the output stream of data as an input for a computing process.

26. The method of claim 19, wherein converting the input stream to the output stream comprises encoding each new portion into the internal quantum state of the quantum processor by:
parameterizing quantum logic gates based on the new portion of the input stream of data; and
executing a quantum logic circuit on the quantum processor, wherein the quantum processor defines input qubits, intermediate qubits, and output qubits, and executing the quantum logic circuit comprises:
applying the parameterized quantum logic gates to the input qubits;
applying multi-qubit quantum logic gates that couple the input qubits with one or more of the intermediate qubits; and
applying multi-qubit quantum logic gates that couple one or more of the intermediate qubits with the output qubits.

27. The method of claim 26, wherein measuring the first part of the internal quantum state of the quantum processor while maintaining the second part of the internal quantum state of the quantum processor comprises, after executing the quantum logic circuit, measuring the output qubits without measuring the input qubits or the intermediate qubits.

* * * * *